United States Patent
Madoglio et al.

(10) Patent No.: US 7,786,914 B2
(45) Date of Patent: Aug. 31, 2010

(54) TIME-INTERLEAVED DELTA-SIGMA MODULATOR

(75) Inventors: Paolo Madoglio, Milan (IT); Ashoke Ravi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 65 days.

(21) Appl. No.: 12/345,524

(22) Filed: Dec. 29, 2008

(65) Prior Publication Data
US 2010/0164774 A1 Jul. 1, 2010

(51) Int. Cl.
H03M 3/00 (2006.01)
(52) U.S. Cl. .............................. 341/143; 341/76; 341/77
(58) Field of Classification Search .................. 341/76, 341/77, 143
See application file for complete search history.

(56) References Cited

U.S. PATENT DOCUMENTS

| 7,145,491 | B2* | 12/2006 | Han et al. .................... 341/141 |
| 7,420,485 | B2* | 9/2008 | Neubauer et al. ............ 341/77 |
| 2007/0241951 | A1 | 10/2007 | Neubauer et al. | |

OTHER PUBLICATIONS

P. P. Vaidyanathan, "Multirate Digital Filters, Filter Bankds, Polyphase Networks, and Applications: A Tutorial," in Proceedings of the IEEE, vol. 78, Issue 1, Jan. 1990, pp. 56-93.

* cited by examiner

*Primary Examiner*—Khai M Nguyen
(74) *Attorney, Agent, or Firm*—Schwabe, Williamson & Wyatt, P.C.

(57) ABSTRACT

Embodiments of the present disclosure provide methods, systems, and apparatuses related to a time-interleaved delta-sigma modulator are described. Other embodiments may be described and claimed.

20 Claims, 7 Drawing Sheets

TIME-INTERLEAVED DELTA-SIGMA MODULATOR

FIELD

Embodiments of the present disclosure relate to the field of circuits and, more particularly, to a time-interleaved delta-sigma modulator.

BACKGROUND

Delta-sigma modulation is widespread in both radio-frequency (RF) and analog/digital conversion fields. A delta-sigma modulator (DSM) uses noise-shaping and oversampling features to push noise and spurs due to device mismatch out of the frequency band of interest, where they can be easily filtered out. The higher the modulator frequency, the higher the amount of noise or spurs that may be filtered. For instance, a DSM may be applied to digital-to-analog converters (DACs) when a high number of bits $N_b$, e.g., greater than eight, is desired. In this case, the desired device matching (limited to a few parts percent) may not be enough to ensure desired linearity. A DSM may provide an output with a lower number of bits, e.g., two or three, at a higher sampling rate but having $N_b$-bit accuracy.

A common topology of a DSM is a multi-stage noise shaping (MASH) modulator. A second-order MASH DSM includes two cascaded accumulators with two output bits derived by combining a carry output of each accumulator to achieve the desired noise shaping function. As each accumulator is equivalent to a first order modulator, any order modulator with a MASH topology may be implemented by cascading accumulators and modifying a logical network combining all the carry outputs. Thus, a MASH modulator may be a cascade of first-order modulators, which may enable modular design without stability issues.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

Various components may be introduced and described in terms of an operation provided by the components. These components may include hardware, software, and/or firmware elements in order to provide the described operations. While some of these components may be shown with a level of specificity, e.g., providing discrete elements in a set arrangement, other embodiments may employ various modifications of elements/arrangements in order to provide the associated operations within the constraints/objectives of a particular embodiment.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Figure 1:
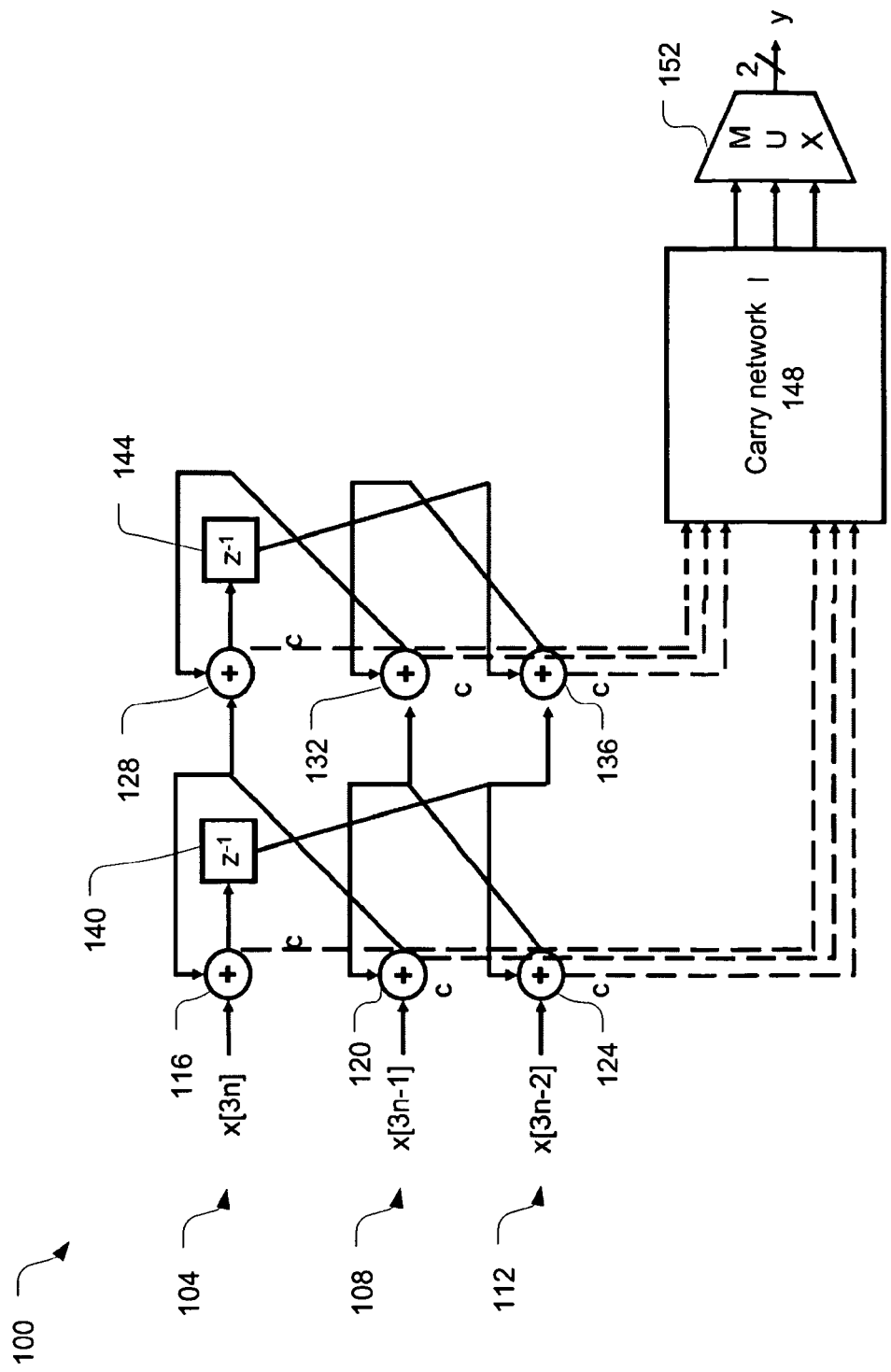
FIG. 1 illustrates a time-interleaved delta-sigma modulator in accordance with some embodiments.

FIG. 1 illustrates a DSM 100 having a time-interleaved topology in accordance with some embodiments. The DSM 100 may include three time-interleaved channels, e.g., channel 104, channel 108, and channel 112, that respectively receive three consecutive samples x[3n], x[3n−1], and x[3n−2] of an input signal x. The input signal x may have, e.g., a four-bit resolution. 3n, 3n−1, and 3n−2, may be indices of the consecutive samples. Therefore, the sample x[3n−1] may immediately precede sample x[3n] and sample x[3n−2] may immediately precede sample x[3n−1]. The clock frequency of the DSM 100 may be one third of the sampling frequency.

Each of the channels may include a first-stage adder, e.g., adders 116, 120, and 124 of channels 104, 108, and 112, respectively, and a second-stage adder, e.g., adders 128, 132, and 136 of channels 104, 108, and 112, respectively. Each of the adders may provide a sum output, indicated by a solid line exiting the adder, and a carry output, indicated by a dashed line exiting the adder, resulting from various logical operations performed on inputs to the adders.

The channel 104 may also include a delay element 140 coupled to the first-stage adder 116 and a delay element 144 coupled to the second-stage adder 128. The first-stage adder 116 may provide its sum output, resulting from logical operations on inputs of the sample x[3n] and a sum output received from the adder 120, to the delay element 140. The delay element 140 may delay the sum output by one clock cycle, e.g., $z^{-1}$, and provide the delayed sum output to adders 124 and 136 of channel 112.

The second-stage adder 128 may receive, as input, a sum output from the first-stage adder 120 and a sum output from the second-stage adder 132. The second-stage adder 128 may provide its sum output to the delay element 144, which may, in turn, provide a delayed sum output to the second-stage adder 136.

The first-stage adder 120 of channel 108 may receive, as input, the sample x[3n−1] and a sum output from first-stage adder 124. As discussed above, the sum output from the first-stage adder 120 may be provided to the first-stage adder 116 and the second-stage adder 128 of the channel 104. The second-stage adder 132 may receive the sum output from first-stage adder 124 and a sum output from the second-stage adder 136 and may provide its sum output to the second-stage adder 128.

The first-stage adder 124 of channel 112 may receive, as input, the sample x[3n−2] and the delayed sum output from delay element 140. The first-stage adder 124 may provide its sum output to the first-stage adder 120 and second-stage adder 132 of channel 108. The second-stage adder 136 of channel 112 may receive, as input, the delayed sum output from delay element 140 and the delayed sum output from delay element 144. The second-stage adder 136 may provide its sum output to the second-stage adder 132.

A carry output from each of the adders may be provided to a carry network 148. The carry network 148 may combine the carry outputs to provide three outputs, which may be coupled to a multiplexer 152. The multiplexer 152 may periodically switch between the three outputs to recover the original sampling rate and output a signal y having, e.g., a two-bit resolution. The output signal y may be a lower-resolution representation of input signal x. The carry network 148 and the multiplexer 152 may be collectively referred to as a combiner network.

The intercoupling of the network of adders over the various channels of the DSM 100 is provided so that outputs of a particular channel are properly based at least in part on the previous samples. Thus, the time-interleaved topology of DSM 100 will still properly reflect the feedback nature of a MASH DSM.

Figure 2B:
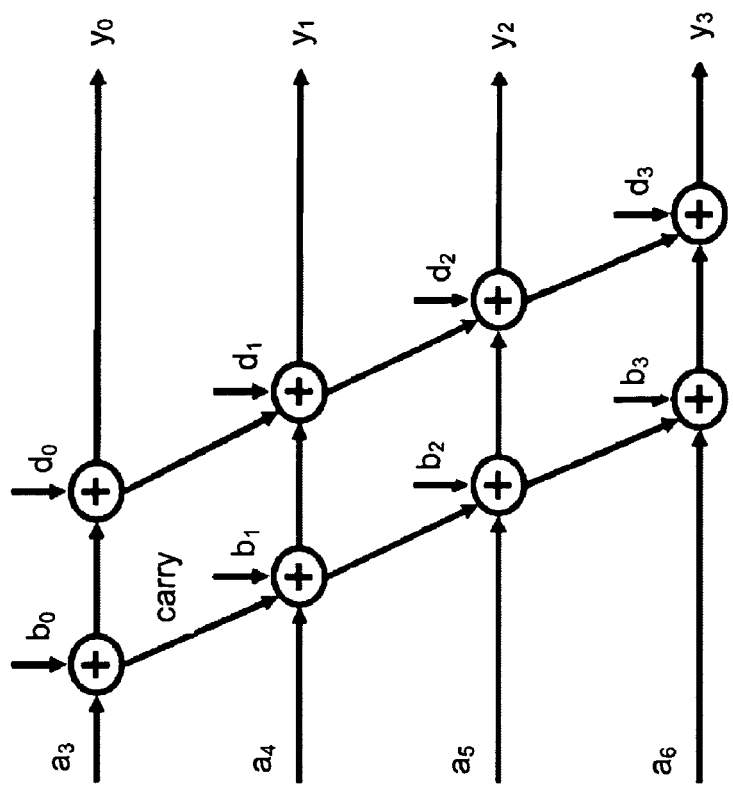
FIG. 2 illustrates an adder arrangement in accordance with some embodiments.

The cascading of the adders of the DSM 100 may provide various timing efficiencies, as will be explained with reference to FIG. 2.

Figure 2A:
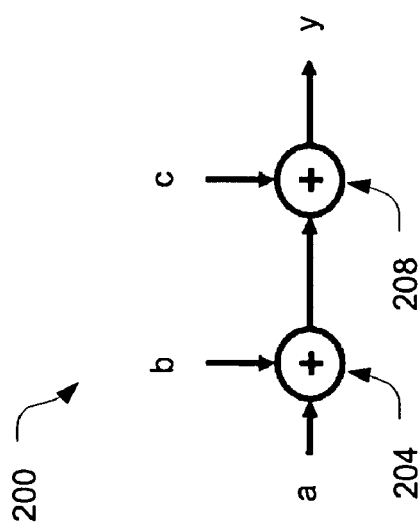

FIG. 2a illustrates an adder arrangement 200 including two cascaded adders 204 and 208 in accordance with some embodiments. Assuming that each of these adders is a multi-bit adder, a portion of the output from adder 204 may be provided to adder 208 prior to the adder 204 completing its entire add operation. This may be seen with reference to the four-bit adder topology shown in FIG. 2b in accordance with an embodiment. Generally, this may result in each additional cascaded adder of a particular adder arrangement 200 increasing the total add operation time of the adder arrangement 200 by approximately one part over the number of bits used in the adders, e.g., twenty-five percent for a four-bit adder. While the total add operation time increases at a fairly moderate rate, the clock period increases by a factor of the number of time-interleaved channels, e.g., two time-interleaved channels doubles the clock period. Recognizing these additive properties may facilitate a true understanding of the potential benefits associated with both intra- and inter-channel cascaded adders.

Referring again to FIG. 1, while some inter-channel coupling of the adders is desired to maintain proper functionality of a time-interleaved MASH DSM, the non-orthogonal network of adders of the DSM 100 may complicate operation in certain embodiments. As used herein, a non-orthogonal network of adders is a network that includes at least one non-orthogonal coupling that results in a sum output or a delayed sum output being provided from an adder of a given stage in a given channel to an adder of a different stage in a different channel. For example, referring to FIG. 1, a non-orthogonal coupling may be the coupling of the first-stage adder 120 of channel 108 to the second-stage adder 128 of channel 104. This type of coupling may increase transit delay experienced by logic through a single operation. This may, in turn, result in the adder network having a relatively high number of bottleneck paths. A bottleneck path may be a path in which the transit time of the logic assumes a value that is highest among all the paths.

Figure 3:
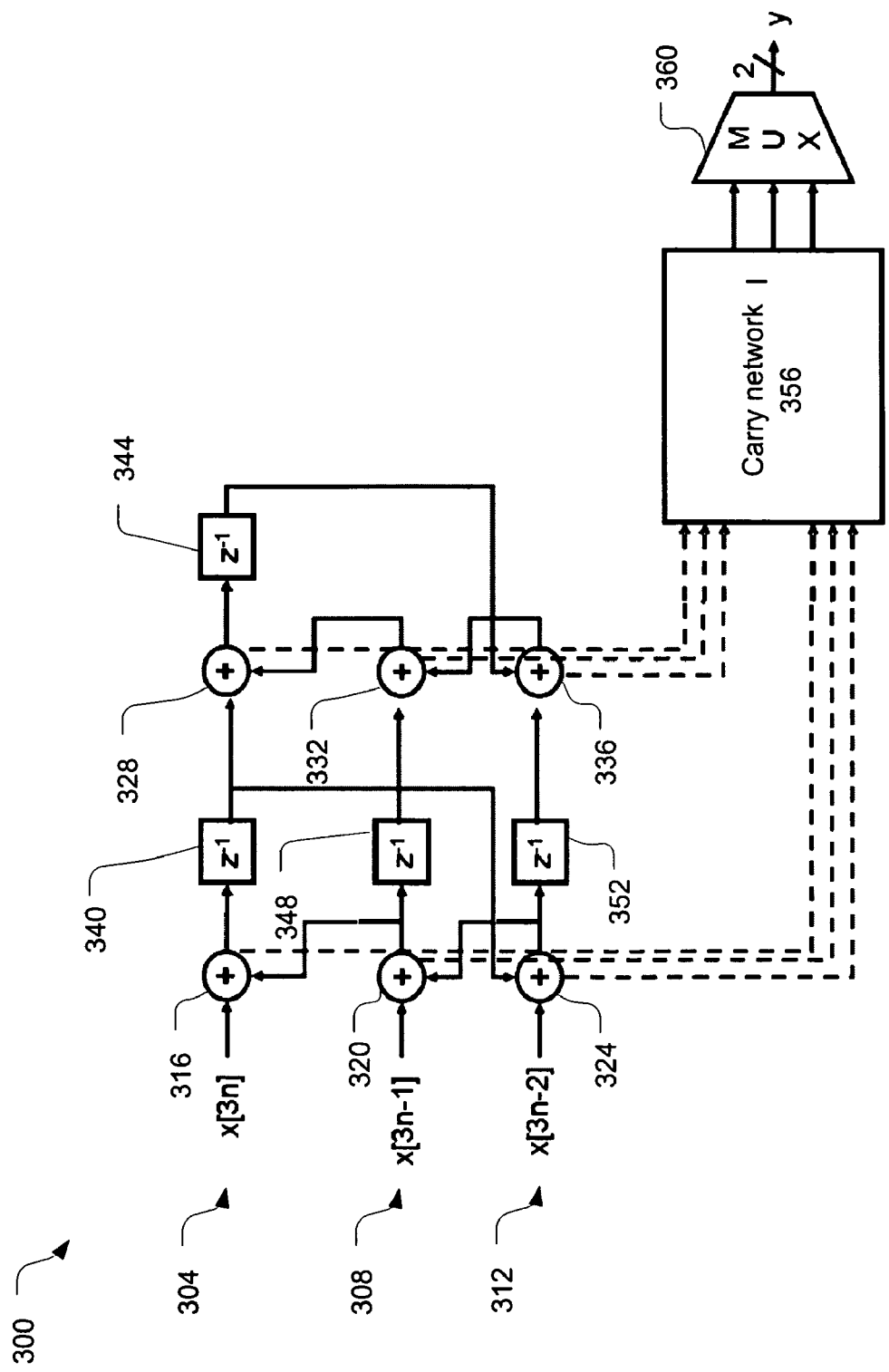
FIG. 3 illustrates a time-interleaved delta-sigma modulator in accordance with some embodiments.

FIG. 3 illustrates a DSM 300 having another time-interleaved topology in accordance with some embodiments. Similar to the DSM 100, the DSM 300 may include three time-interleaved channels, e.g., channel 304, channel 308, and channel 312 that respectively receive three consecutive samples x[3n], x[3n−1], and x[3n−2] of an input signal x.

Also similar to DSM 100, each of the channels of the DSM 300 may include a first stage adder, e.g., adders 316, 320, and 324 of channels 304, 308, and 312, respectively, and a second stage adder, e.g., adders 328, 332, and 336 of channels 304, 308, and 312, respectively. However, unlike DSM 100, the DSM 300 may have a delay element separating the adders of each channel. For example, not only does the DSM 300 include delay elements 340 and 344 in channel 304, it also includes delay element 348 in channel 308 and delay element 352 in channel 312. The timing flexibility provided by these additional delay elements may allow the adders of the DSM 300 to be orthogonally coupled to one another resulting in an orthogonal network. The orthogonal network of adders in DSM 300 may have fewer bottleneck paths than the non-orthogonal network of adders in DSM 100.

The coupling arrangements of the elements of the channel 304 may be explained as follows. The first-stage adder 316 may receive, as inputs, the sample x[3n] and a sum output from first-stage adder 320 and provide a sum output to the delay element 340. The delay element 340 may provide a delayed sum output to the second-stage adder 328 and to the first-stage adder 324. The second-stage adder 328 may receive, as input, a sum output from the second-stage adder 332 in addition to the delayed sum output from the delay element 340. The second-stage adder 328 may provide its sum output to the delay element 344, which may, in turn, provide its delayed sum output to the second-stage adder 336.

The coupling arrangements of the elements of the channel 308 may be explained as follows. The first-stage adder 320 may receive, as inputs, the sample x[3n−1] and a sum output from the first-stage adder 324 and provide a sum output to the delay element 348. The delay element 348 may provide a delayed sum output to the second-stage adder 332. The second-stage adder 332 may receive, as input, a sum output from the second-stage adder 336 in addition to the delayed sum output from the delay element 348.

The coupling arrangements of the elements of the channel 312 may be explained as follows. The first-stage adder 324 may receive, as inputs, the sample x[3n−2] and a delayed sum output from the delay element 340 and provide a sum output to the delay element 352 and to the first-stage adder 320. The delay element 352 may provide a delayed sum output to the second-stage adder 336. The second-stage adder 336 may receive, as input, a delayed sum output from the delay element 344 in addition to the delayed sum output from the delay element 352.

A carry output from each of the adders may be provided to a carry network 356. The carry network 356 may combine the carry outputs to provide three outputs, which may be coupled to a multiplexer 360. The multiplexer 360 may periodically switch between the three outputs to recover the original sampling rate and output a signal y having, e.g., a two-bit resolution. The output signal y may be a lower-resolution representation of input signal x. The carry network 356 and the multiplexer 360 may be collectively referred to as a combiner network.

Figure 4:
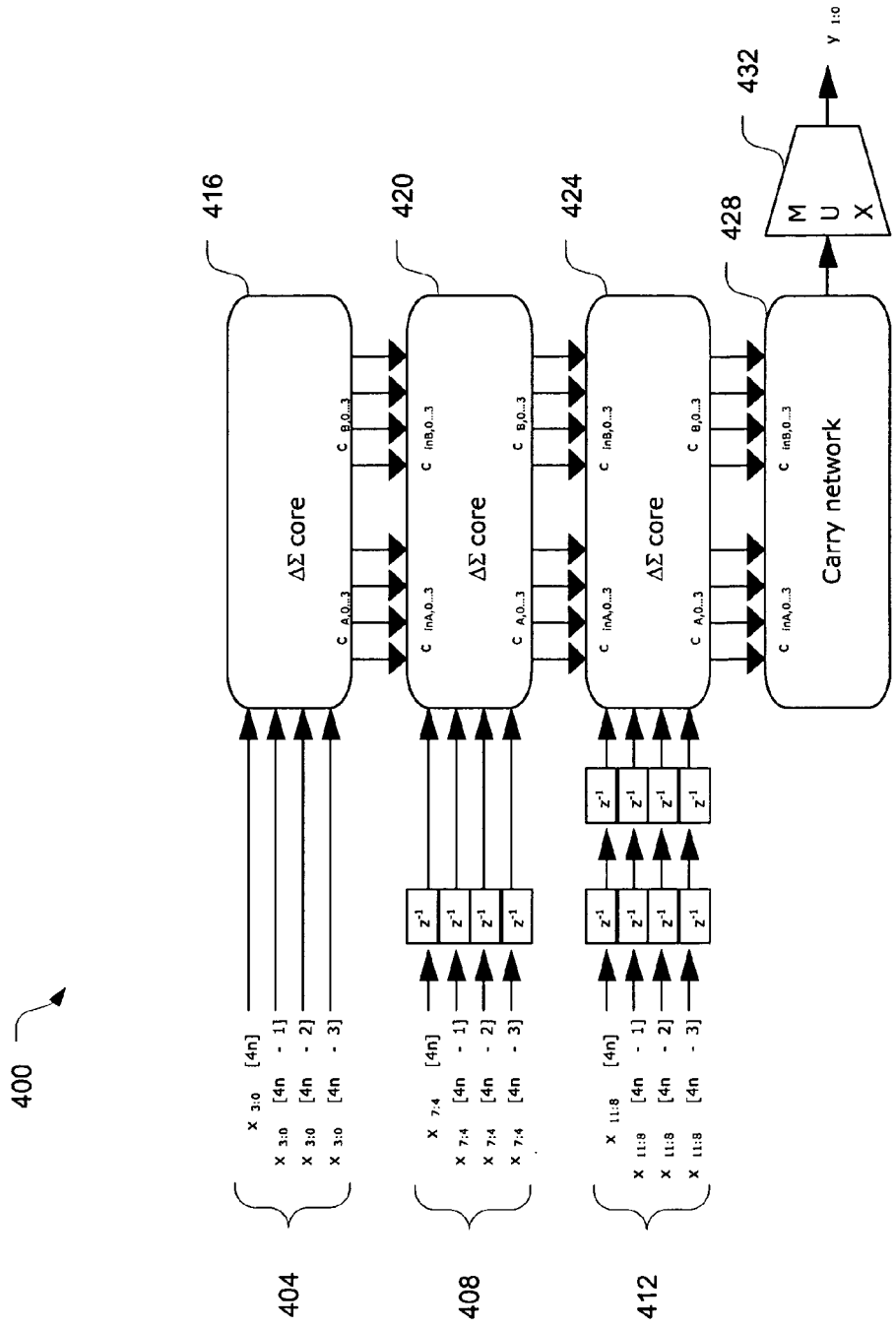
FIG. 4 illustrates a time-interleaved, pipelined delta-sigma modulator in accordance with some embodiments.

FIG. 4 illustrates a pipelined DSM 400 having a time-interleaved topology in accordance with some other embodiments. The DSM 400 may include three pipeline sections, e.g., pipeline sections 404, 408, and 412, with each pipeline section receiving a portion of an input signal x. The pipeline section 404 may receive the four least-significant bits (LSBs), e.g., 3:0, of the input signal x, the pipeline section 408 may receive the next four bits, e.g., 7:4, of the input signal x, and the pipeline section 412 may receive the four most-significant bits (MSBs), e.g., 11:8, of the input signal x. The portions of the input signal x provided to the pipeline section 408 may be delayed by one delay element, while the portions of the input signal provided to the pipeline section 412 may be delayed by two delay elements.

Each of the pipeline sections may have a number of time-interleaved channels configured to respectively receive consecutive samples of respective portions of the input signal x. For example, the pipeline section 404 may have a first channel to receive $x_{3:0}[4n]$, a second channel to receive $x_{3:0}[4n-1]$, a third channel to receive $x_{3:0}[4n-2]$, and a fourth channel to receive $x_{3:0}[4n-3]$; the pipeline section 408 may have a first channel to receive $x_{7:4}[4n]$, a second channel to receive $x_{7:4}[4n-1]$, a third channel to receive $x_{7:4}[4n-2]$, and a fourth channel to receive $x_{7:4}[4n-3]$; and the pipeline section 412 may have a first channel to receive $x_{11:8}[4n]$, a second channel to receive $x_{11:8}[4n-1]$, a third channel to receive $x_{11:8}[4n-2]$, and a fourth channel to receive $x_{11:8}[4n-3]$.

The DSM 400 may include a core 416 corresponding to the pipeline section 404, core 420 corresponding to the pipeline section 408, and core 424 corresponding to the pipeline section 412. The cores may be coupled to one another and to a carry network 428 and multiplexer 432 to provide output signal y, which is shown with a two-bit resolution. The cores may be coupled to one another in an orthogonal manner due to timing provided by the various delay elements.

Figure 5:
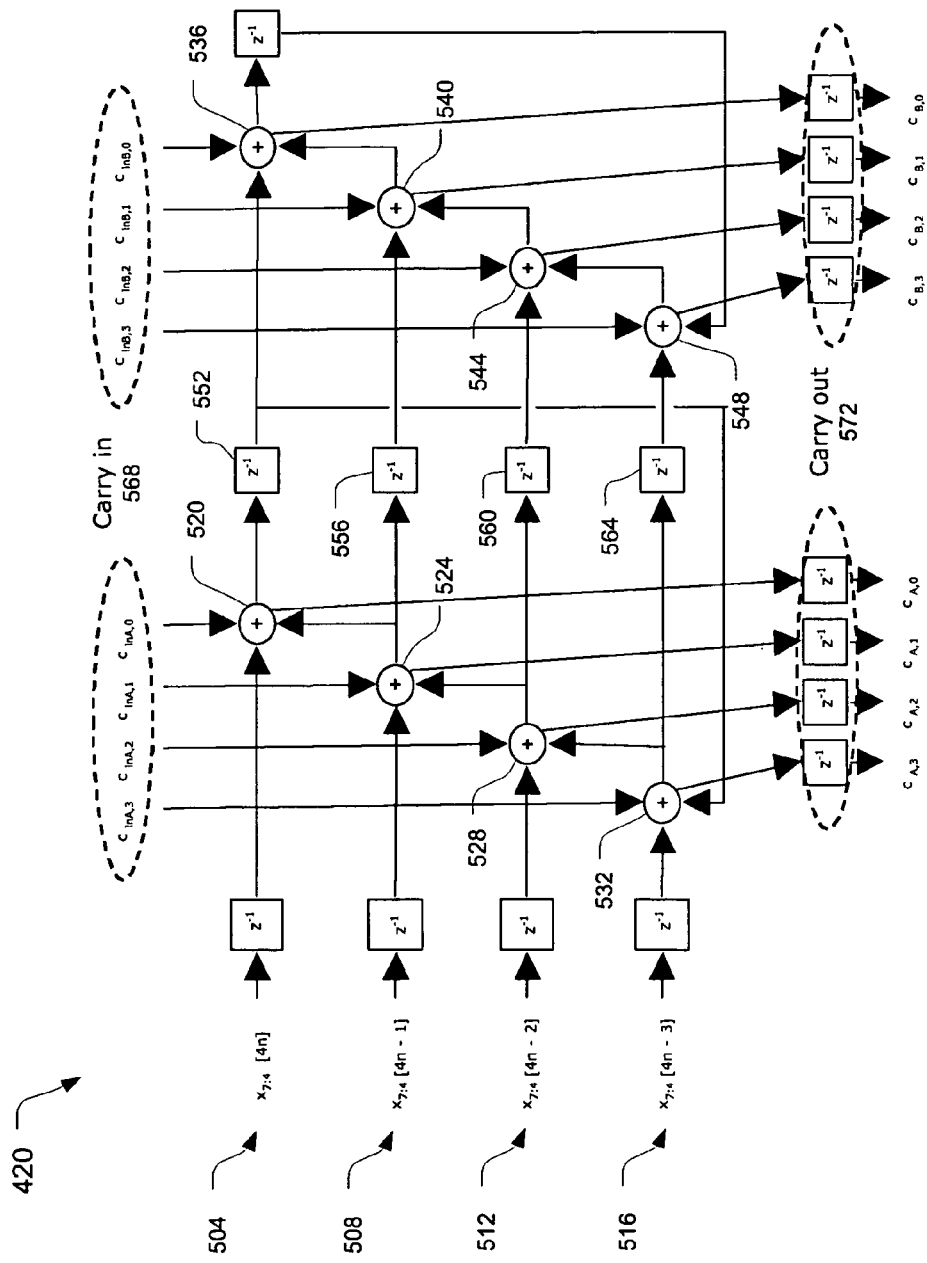
FIG. 5 illustrates a core of a time-interleaved delta-sigma modulator in accordance with some embodiments.

FIG. 5 illustrates core 420 in additional detail in accordance with some embodiments. The core 420 may include channels 504, 508, 512, and 516 that respectively receive the four consecutive samples x[4n], x[4n−1], x[4n−2], and x[4n−3] of the input signal x.

Each of the channels of the core 420 may include a first stage adder, e.g., adders 520, 524, 528, and 532 of channels 504, 508, 512, and 516, respectively, and a second stage adder, e.g., adders 536, 540, 544, and 548 of channels 504, 508, 512, and 516, respectively. Similar to DSM 300, the core 420 may have an orthogonal network of adders at least partially enabled by timing provided by delay elements 552, 556, 560, and 564 of channels 504, 508, 512, and 516, respectively.

The adders in core 420 may be full adders to receive, as a third input, carry inputs 568, from the core 416 as shown. The adders in core 420 may provide carry outputs 572 to core 424 as shown.

It may be noted any number of time-interleaved channels and pipeline sections may be used in this and other embodiments.

Figure 6:
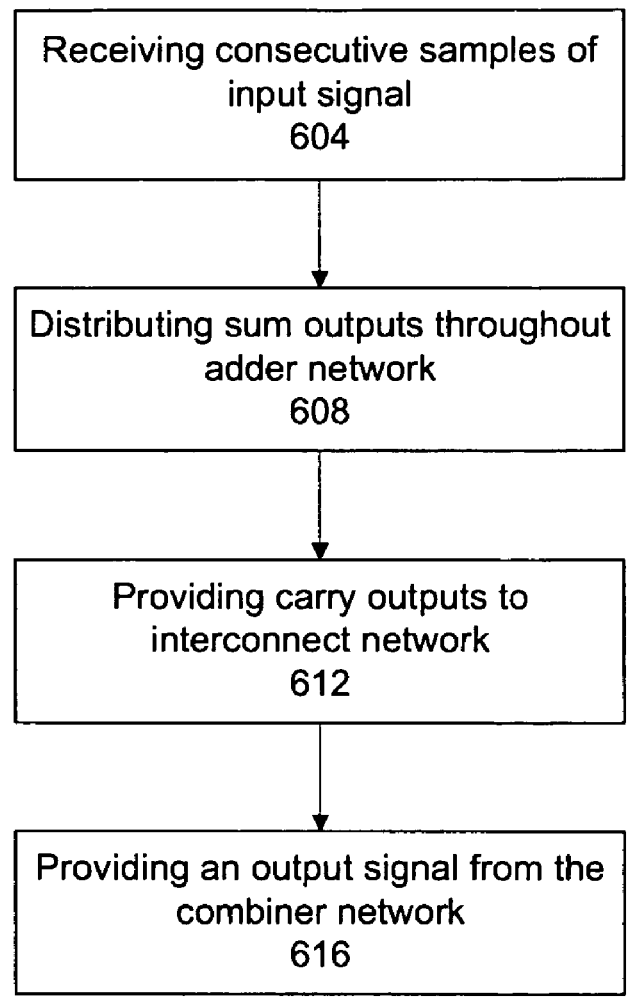
FIG. 6 is a flowchart describing operation of a time-interleaved delta-sigma modulator in accordance with some embodiments.

FIG. 6 is a flowchart 600 describing operation of a time-interleaved DSM in accordance with some embodiments. At block 604, time-interleaved channels of a DSM may respectively receive consecutive samples of an input signal.

At block 608, various adding operations may be performed by adders of an adder network with resulting sum outputs distributed throughout the adder network. The sum outputs may be delayed by strategically placed delay elements as described by the above embodiments. For example, delay elements may be placed in each channel between adders of adjacent stages. Such strategic placement of the delay elements may allow the sum outputs to be distributed through an orthogonal network of the adders, e.g., distributed only along orthogonal couplings within the adder network.

At block 612, carry outputs, resulting from the various adding operations of the adder network, may be provided to an combiner network. The combiner network may, at block 616, provide an output signal, which is a low-resolution representation of the input signal.

DSMs of embodiments of the present disclosure may offer high resolution and a degree of immunity to mismatch and variations by shaping the noise outside of a signal band. The time-interleaving of the DSMs may allow them to operate at a lower operating frequency without sacrificing performance. In some embodiments, the disclosed topology works with N consecutive samples of an input digital word at N times lower clock rate. The DSM sample rate of these embodiments may not be affected by the clock frequency reduction since more samples are processed for each clock period. This may, in turn, allow these DSMs to use standard digital cells, in lieu of custom digital cells, thereby reducing costs and design/implementation complexity. For example, using standard digital cells may allow the entire modulator to be designed through the use of tools that receive text code, e.g., hardware description language (HDL) code, describing the modulator's functional behavior and automatically generates the modulator schematic and layout that ensures correct functionality and meets desired timing constraints.

Figure 7:
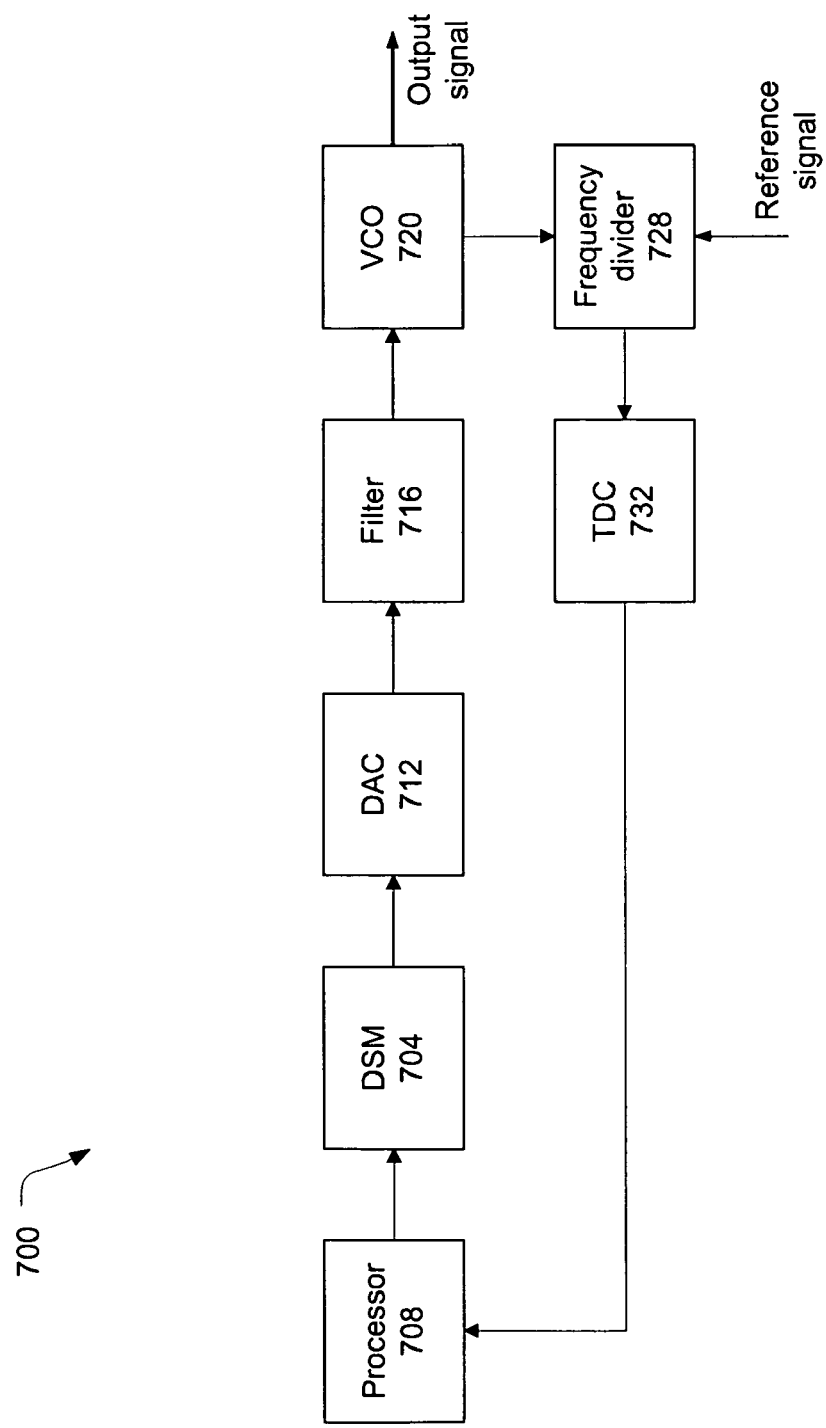
FIG. 7 illustrates a digital frequency synthesizer in accordance with some embodiments.

DSMs of embodiments of the present disclosure may be used in RF transceiver components such as fractional-N synthesizers, direct digital synthesizers, delay-locked loop or phase-locked loop modulators, digital RF transmitters, data converters, etc. FIG. 7 describes a digital frequency synthesizer 700 utilizing a DSM 704 in accordance with some embodiments. The synthesizer 700 may have a processor 708, e.g., a digital filter, to provide an input signal to the DSM 704. The DSM 704 may generate an output signal in accordance with any of the various embodiments described above. The output signal may be used to drive a high-speed, low-number-of-bit digital-to-analog converter (DAC) 712 with a high effective number of bits. The DAC 712 analog output may be low-pass filtered by filter 716 and used to drive a voltage controlled oscillator (VCO) 720. The analog output from the DAC 712 may set a frequency value for the VCO 720. The signal output from the OCN 720 may be an output signal of the digital frequency synthesizer 700. The output signal may also be fed to a frequency divider 728 and compared with a fixed frequency reference signal. The delay between these two signals may be digitized by a time-to-digital converter (TDC) 732 and sent to the processor 708. The processor 708 may then adjust the input signal to the DSM 704 accordingly.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. Similarly, memory devices of the present disclosure may be employed in host devices having other architectures. This application is intended to cover any adaptations or variations of the embodiments discussed herein. Therefore, it is manifestly intended that embodiments in accordance with the present disclosure be limited only by the claims and the equivalents thereof.

What is claimed is:

1. A method comprising:
   receiving, at a plurality of channels of a delta-sigma modulator, a respective plurality of consecutive samples of an input signal having a first resolution;
   generating, in each of the plurality of channels, a plurality of sum outputs and a plurality of carry outputs based at least in part on respective samples of the input signal;
   delaying a first sum output in each of the plurality of channels; and
   combining the plurality of carry outputs from each of the plurality of channels to generate an output signal, with a second resolution, that is representative of the input signal.

2. The method of claim 1, wherein said receiving the respective plurality of consecutive samples comprises receiving a first sample by the first channel, receiving a second sample, which immediately precedes the first sample, by the second channel, and receiving a third sample, which immediately precedes the second sample, by the third channel, and the method further comprises:
   providing, by a delay element of the first channel, a delayed sum output to a first-stage adder of the third channel.

3. The method of claim 2, wherein said providing, by the delay element of the first channel, the delayed sum output further comprises:
   providing the delayed sum output only to a second-stage adder of the first channel and the first-stage adder of the third channel.

4. The method of claim 2, further comprising:
   providing, by the first-stage adder of the third channel, a sum output to a first-stage adder of the second channel and to a delay element of the third channel.

5. The method of claim 4, further comprising:
   providing, by the first-stage adder of the second channel, a sum output to the first-stage adder of the first channel and to a delay element of the second channel.

6. The method of claim 2, further comprising:
   providing, by a second-stage adder of the first channel, a sum output to another delay element of the first channel; and
   providing, by the another delay element, a delayed sum output to a second-stage adder of the third channel.

7. The method of claim 6, further comprising:
   providing, by the second-stage adder of the third channel, a sum output to a second-stage adder of the second channel; and
   providing, by the second-stage adder of the second channel, a sum output to the second-stage adder of the first channel.

8. The method of claim 2, further comprising:
   providing, by the delay element of the first channel, a delayed sum output only to the first-stage adder of the third channel and a second-stage adder of the first channel.

9. The method of claim 1, wherein said receiving the respective plurality of consecutive samples comprises receiving a first sample by the first channel and the method further comprises:
   transmitting a portion of the first sample through a first pipeline section of the first channel, the first pipeline section having the first-stage adder, the delay element, and the second-stage adder of the first channel; and
   transmitting another portion of the first sample through a second pipeline section of the first channel, the second pipeline section having another first-stage adder, another delay element, and another second-stage adder.

10. A delta-sigma modulator (DSM) comprising:
    a plurality of channels configured to receive a respective plurality of consecutive samples of an input signal having a first resolution, the plurality of channels including a plurality of adders, arranged in an orthogonal network, with each of the plurality of adders configured to provide a sum output to one or more other adders of the plurality of adders and further configured to provide a carry output; and
    a combiner network coupled to the plurality of channels and configured to receive the carry output from each of the plurality of adders and to provide, based at least in part on the received carry outputs, an output signal having a second resolution.

11. The DSM of claim 10, wherein each of the plurality of channels further includes:
    a first-stage adder, a second-stage adder, and a delay element configured to receive a sum output from the first-stage adder and to provide a delayed sum output to the second-stage adder.

12. The DSM of claim 11, wherein the plurality of channels includes a first channel configured to receive a first sample of the plurality of consecutive samples, a second channel configured to receive a second sample of the plurality of consecutive samples, the second sample immediately preceding the first sample; and a third channel configured to receive a third sample of the plurality of consecutive samples, the third sample immediately preceding the second sample, and the delay element of the first channel is further configured to provide a delayed sum output to the first-stage adder of the third channel.

13. An apparatus comprising:
    a first pipeline section having a first channel to receive a first sample of a first portion of an input signal and a second channel to receive a second sample of the first portion of the input signal;
    a second pipeline section having a first channel to receive a first sample of a second portion of the input signal and a second channel to receive a second sample of the second portion of the input signal;
    a first delta-sigma core coupled to the first pipeline section and configured to output a plurality of carry outputs based at least in part on the first and second samples of the first portion of the input signal; and
    a second delta-sigma core coupled to the second pipeline section and to the first delta-sigma core and configured to output a plurality of carry outputs based at least in part on the first and second samples of the second portion of the input signal and the plurality of carry outputs output by the first delta-sigma core.

14. The apparatus of claim 13, wherein the first delta-sigma core comprises an orthogonal network of adders.

15. The apparatus of claim 13, wherein each of the first channel and the second channel of the first delta-sigma core include a first-stage adder, a second-stage adder, and a delay element configured to receive a sum output from the first-stage adder and to provide a delayed sum output to the second-stage adder.

16. The apparatus of claim 15, wherein the first-stage adder of the second channel is coupled to the first-stage adder of the first channel and configured to provide a sum output to the first-stage adder of the first channel.

17. The apparatus of claim 16, wherein the second-stage adder of the second channel is coupled to the second-stage adder of the first channel and configured to provide a sum output to the second-stage adder of the first channel.

18. The apparatus of claim 13, further comprising:
a combiner network coupled to the second delta-sigma core and configured to combine the plurality of carry outputs from the second-delta sigma core to generate an output signal that is representative of the input signal.

19. The apparatus of claim 13, further comprising:
a processor to provide the input signal;
a delta-sigma modulator including the first pipeline section, the second pipeline section, the first delta-sigma core, and the second delta-sigma core, and configured to provide an output signal that is representative of the input signal; and
an oscillator control node coupled to the delta-sigma modulator and configured to control an oscillator based at least in part on the output signal.

20. The apparatus of claim 19, wherein the apparatus is a digital frequency synthesizer.

* * * * *